(12) United States Patent
Stamatescu et al.

(10) Patent No.: US 9,557,390 B2
(45) Date of Patent: Jan. 31, 2017

(54) NOISE REDUCTION CIRCUITRY FOR A METAL DETECTOR

(71) Applicant: Minelab Electronics Pty Limited, Torrensville, South Australia (AU)

(72) Inventors: Laurentiu Stamatescu, Torrensville (AU); Sergii Shapoval, Torrensville (AU); Lachlan Gunn, Torrensville (AU)

(73) Assignee: Minelab Electronics Pty Limited, Torrensville, South Australia (AU)

( * ) Notice: Subject to any disclaimer, the term of this patent is extended or adjusted under 35 U.S.C. 154(b) by 32 days.

(21) Appl. No.: 14/014,011

(22) Filed: Aug. 29, 2013

(65) Prior Publication Data

US 2014/0062488 A1     Mar. 6, 2014

(30) Foreign Application Priority Data

Aug. 29, 2012   (AU) ................................ 2012903739

(51) Int. Cl.
*A61B 5/05*     (2006.01)
*G01R 33/00*   (2006.01)
*G01V 3/08*     (2006.01)

(52) U.S. Cl.
CPC .......... *G01R 33/0029* (2013.01); *G01V 3/088* (2013.01)

(58) Field of Classification Search
CPC . G01R 33/0029; G06F 13/4086; G01V 3/101; H01J 37/3266; A61N 1/3787; A61N 1/37223; A61N 1/08; A61N 1/36125; A61N 1/36146; H02J 7/025; A61B 5/053; A61B 2018/00875; A61B 5/05

USPC .......... 324/326, 243, 329, 239, 207.26, 67, 327,324/228; 702/81; 340/635
See application file for complete search history.

(56) References Cited

U.S. PATENT DOCUMENTS

| 2,937,355 | A | * | 5/1960 | McNally | .................. | H01C 3/02 |
| | | | | | | 338/62 |
| 4,006,407 | A | | 2/1977 | Flaherty et al. | | |
| 4,030,026 | A | | 6/1977 | Payne | | |
| 4,563,645 | A | * | 1/1986 | Kerr | ....................... | G01V 3/107 |
| | | | | | | 324/233 |

(Continued)

FOREIGN PATENT DOCUMENTS

| JP | 2000147111 | 5/2000 |
| JP | 2004264266 | 9/2004 |
| JP | 2007121044 | 5/2007 |

*Primary Examiner* — Son Le
*Assistant Examiner* — Akm Zakaria
(74) *Attorney, Agent, or Firm* — The Webb Law Firm

(57) ABSTRACT

A method for detecting a change of an impedance of a magnetic field receiver of a metal detector, including: having a first network of passive components, including the impedance of the magnetic field receiver; having a second network of passive components, excluding the impedance of the magnetic field receiver; and processing a first measurement signal from a first node of the first network with a second measurement signal from a second node of the second network to detect the change in the impedance of the magnetic field receiver; wherein the first network, the second network, the first node, the second node is configured such that in an absence of an external influence which affects the impedance of the magnetic field receiver, the first measurement signal is substantially the same with the second measurement signal; and in a presence of the external influence, the first measurement signal is different from the second measurement signal.

16 Claims, 7 Drawing Sheets

(56) References Cited

U.S. PATENT DOCUMENTS

| | | | |
|---|---|---|---|
| 4,628,265 A * | 12/1986 | Johnson | G01V 3/107 324/225 |
| 4,854,113 A | 8/1989 | Strosser et al. | |
| 4,866,380 A * | 9/1989 | Meins | G01B 7/02 104/284 |
| 4,890,064 A * | 12/1989 | Candy | G01V 3/107 324/262 |
| 5,287,008 A * | 2/1994 | Pahr | H02H 9/005 307/89 |
| 5,689,184 A | 11/1997 | Jeffers et al. | |
| 5,691,640 A | 11/1997 | King | |
| 5,729,143 A | 3/1998 | Tavernetti et al. | |
| 5,786,697 A | 7/1998 | Khazam et al. | |
| 5,841,272 A * | 11/1998 | Smith | G01R 15/146 324/117 H |
| 6,326,790 B1 * | 12/2001 | Ott | G01V 3/15 324/236 |
| 6,879,161 B2 * | 4/2005 | Rowan | G01V 3/104 324/329 |
| 6,927,577 B2 | 8/2005 | Nelson | |
| 7,391,217 B2 | 6/2008 | Linse et al. | |
| 7,466,134 B2 * | 12/2008 | McCarty | G01N 27/72 324/326 |
| 7,759,939 B2 * | 7/2010 | Skultety-Betz | G01V 3/104 324/242 |
| 8,473,235 B2 * | 6/2013 | Kittel | G01V 3/104 324/222 |
| 2006/0164105 A1 * | 7/2006 | Westersten | G01V 3/107 324/654 |
| 2009/0190274 A1 * | 7/2009 | Ko | H02H 9/023 361/19 |
| 2012/0098667 A1 * | 4/2012 | McAdam | G01V 3/107 340/635 |
| 2013/0057286 A1 * | 3/2013 | Jones | G01R 33/1215 324/329 |

\* cited by examiner

NOISE REDUCTION CIRCUITRY FOR A METAL DETECTOR

CROSS-REFERENCE TO RELATED APPLICATION

This application claims priority from Australian Patent Application No. 2012903739 filed on Aug. 29, 2012, and titled "An Electrical Device Having Noise Reduction Circuitry." The content of this application is hereby incorporated by reference in its entirety.

TECHNICAL FIELD

The current invention relates to metal detectors that take measurements of at least one small electrical signal resulting from the cancellation of larger electrical signals applied to a network of passive components.

BACKGROUND

There is a number of situations in which it is desirable to make high accuracy measurements of a small signal resulting from the cancellation of larger signals applied to a network of passive components. The signal sources have noise that, in general, does not cancel the same way the signal does. This represents one of the main elements limiting the accuracy of this type of measurement. Examples of measurements that use signal cancellation and are subject to the noise limitation are instruments for the precision measurements of passive components, such as LCR bridges, sensor measurement circuits etc. One example of a situation where the application of the general principles is relevant is in the field of metal detectors.

Metal detectors employing simultaneous transmission and reception, known as continuous wave (CW) detectors or very low frequency (VLF) detectors, require that their transmit and receive coils are magnetically decoupled from each other. In the terminology used in this field, it is said that they are in an induction balanced or nulled arrangement. In this way, the weak signals originating from the targets excited by the transmitter are not obscured by the strong transmitted signal. Since the amplifier that is connected to the receive coil has a gain of the order of hundreds, the nulling of the coils (the attenuation of the direct or feed through signal) must be at least of the order of thousands. This requirement adds to the complexity of coil construction and therefore to the total cost. It also precludes or makes much more difficult the integration of CW metal detectors with other types of sensors, such as like ground penetrating radars, and the construction of arrays of metal detectors.

There are types of metal detectors that do not require induction balanced or nulled coils. For example, pulse-induction metal detectors use non-overlapping transmit and receive periods and therefore can use un-nulled coils or even the same coil (named mono-loop) for both transmission and reception. However, these detectors have disadvantages such as higher power consumption, higher cost and significant susceptibility to electromagnetic interference. At the other end of the scale, the very simple beat frequency oscillator (BFO) metal detectors employ a relatively stable internal oscillator and another oscillator constructed around the sensing coil. When the coil is brought in the presence of metal, its inductance changes and so does the frequency of its associated oscillator. The difference between the two frequencies (the beat signal) is amplified and transformed into an audible signal, such that a change in the pitch of the sound indicates the presence of metal. This type of detector is very simple and cheap to make, but is very limited in terms of discrimination and ground rejection.

The advantages of the CW detectors of high sensitivity, lower power consumption and simpler construction would benefit greatly from a coil that does not require nulling. There have been a number of approaches to perform electronic nulling, from the fixed arrangement described in the U.S. Pat. No. 4,030,026 to the adaptive systems described in the U.S. Pat. No. 4,006,407, U.S. Pat. No. 5,691,640 and the U.S. Pat. No. 5,729,143. However, all of these have in common the fact that the electronic nulling is only a fine adjustment applied after the transmit-receive coils are coarsely nulled.

The signal applied to the transmit coil of a metal detector can be either generated by an oscillator that includes the transmitter coil (which therefore tunes itself to the frequency of the resonant circuit) or generated by a separate oscillator and applied to the amplifier that drives the resonant circuit. The second option is also used for non-resonant operation. In all cases, the amplitude of the transmitted signal must be maintained as constant as possible, either through active means, such as feedback control of amplitude, or through careful design of the electronic circuits. If the requirements of amplitude stability are not met, the amplitude fluctuations propagate through the residual coupling between the transmit-receive coils and cause an increase in the detection noise floor. The result is the equivalent of a significant reduction in the sensitivity or the detection depth of the detector.

Most metal detectors that attempt to provide electronic nulling deal with this problem by either deriving the nulling signal from the transmitted signal itself or by using separate signal sources with extremely low intrinsic noise. It should be noted that, because of the parasitic circuit elements, the signal required to balance the receive coil may not be totally in phase or anti-phase with the transmitted signal.

Therefore, the first approach, more suited to analogue processing, requires that signals with adjustable amplitude and phase must be generated from the transmitted signal while maintaining the amplitude fluctuations. Only in this situation can the fluctuations in amplitude of the transmit signals induced in the receive coil be cancelled by the amplitude fluctuations of the nulling signal.

The second approach, more suited to digital processing, has the disadvantage that it requires the sources for both transmit and nulling signals to have a noise amplitude level comparable with that of the receiver amplifier. Because the noise of these two sources is not correlated, their noise adds in root-mean-square terms. Therefore, the noise of these two sources used in an electronic nulling circuit must be lower than that of the source used in the nulled coil set-up, by a factor comparable to the receiver amplifier gain, in order to obtain comparable results.

Based on advances in the digital signal processing and mixed signal components, it is now possible to construct CW metal detectors where the transmitted signals are generated numerically before being converted to electric signals with a digital-to-analogue converter (DAC). At the same time, the received signals are digitised with an analogue-to-digital converter (ADC), with the rest of signal processing performed in software.

SUMMARY OF THE INVENTION

The current invention is for an electrical device that takes measurements of at least one small electrical signal resulting from the cancellation of larger electrical signals applied to a network of passive components where said device has at least two separate electric signal sources for the larger signals and at least one additional measurement path to cancel, or at least reduce, any noise from the electric signal sources.

According to a first aspect of the present invention, there is provided a method for detecting a change of an impedance of a magnetic field receiver of a metal detector, including: having a first network of passive components, including the impedance of the magnetic field receiver; having a second network of passive components, excluding the impedance of the magnetic field receiver; and processing a first measurement signal from a first node of the first network with a second measurement signal from a second node of the second network to detect the change in the impedance of the magnetic field receiver; wherein the first network, the second network, the first node, the second node is configured such that in an absence of an external influence which affects the impedance of the magnetic field receiver, the first measurement signal is substantially the same with the second measurement signal; and in a presence of the external influence, the first measurement signal is different from the second measurement signal.

In one form, the first network of passive components includes a first coil, wherein the first coil is made of bifilar windings of wire such that the resistance of the first coil is non-zero and the inductance of the first coil is effective zero. In one form, the bifilar windings of wire are bifilar windings of twisted wire.

In one form, the magnetic field receiver is a second coil, and wherein windings of the first coil and windings of the second coil are positioned close to each other to allow thermal coupling between them. In one form, the first network of passive components includes a low-temperature coefficient resistor in series with the first coil to reduce the effective temperature coefficient of the first coil. In one form, the second coil is made of Litz wire to reduce or eliminate proximity effect losses within the windings. In one form, first network, the second network, the first node, the second node is configured such that when a first impedance ratio of passive components within the first network and a second impedance ratio of passive components within the second network is the same, the first measurement signal is substantially the same with the second measurement signal in the absence of the external influence.

In one form, the first network of passive components further includes the impedance of a magnetic field transmitter of the metal detector. In one form, the first network of passive components further includes a capacitor with impedance equals to the opposite of that of an inductance of the magnetic field transmitter. In one form, the magnetic field transmitter and the magnetic field receiver are the same entity. In one form, noise on the first measurement signal is cancelled or at least reduced by subtracting the second measurement signal from the first measurement signal. In one form, the method further includes: having a first generator and a second generator separate from the first generator to generate two signals to the first network of passive components and the second network of passive components, the two signals are generated within a few degrees of 180 degrees relative to each other. In one form, the method further includes: having a first generator and a low-noise amplifier to generate signals to the first network of passive components, and the second network of passive components, the low-noise amplifier producing an inverting signal based on the signal from the first generator, the signals are generated/produced within a few degrees of 180 degrees relative to each other. In one form, frequency of the first generator is selected to be the resonant frequency of the first network.

In one form, the second network of passive components further include a potentiometer, configurable to match the ratio of resistances of the second network of passive components to the ratio of resistances of the first network of passive components.

According to a second aspect of the present invention, there is provided a metal detector for detecting a target by detecting a change of an impedance of a magnetic field receiver of the metal detector including: a first network of passive components, including the impedance of magnetic field receiver; a second network of passive components, excluding the impedance of the magnetic field receiver; and a processor for processing a first measurement signal from a first node of the first network with a second measurement signal from a second node of the second network to detect the change in the impedance of the magnetic field receiver; wherein the first network, the second network, the first node, the second node is configured such that in an absence of an external influence which affects the impedance of the magnetic field receiver, the first measurement signal is substantially the same with the second measurement signal; and in a presence of the external influence, the first measurement signal is different from the second measurement signal.

According to a third aspect of the present invention there is provided a metal detector configurable to perform the method of the first aspect and/or its various forms.

BRIEF DESCRIPTION OF DRAWINGS

Embodiments of the present invention will be discussed with reference to the accompanying drawings wherein.

DETAILED DESCRIPTION

Figure 1:
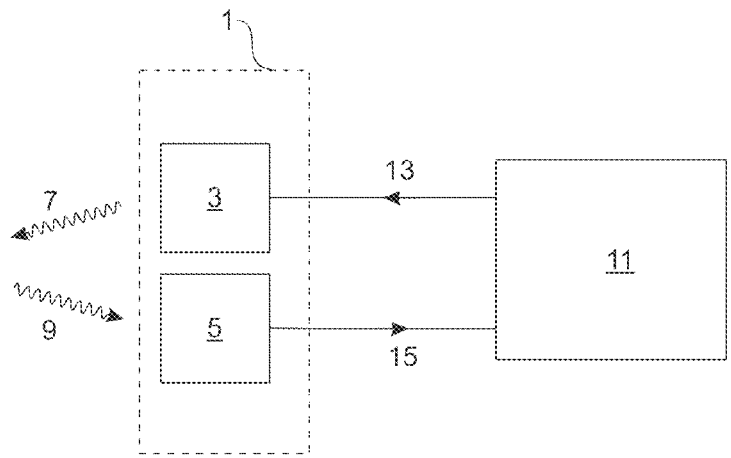
FIG. 1 is a functional block diagram showing the main parts of a metal detector.

FIG. 1 is a functional block diagram showing the main parts of a metal detector. The metal detector includes a sensing head 1, that includes a magnetic field transmitter 3 and a magnetic field receiver 5, to transmit a transmit magnetic field 7 and to receive a receive magnetic field 9, respectively. The magnetic field transmitter 3 and a magnetic field receiver 5 may be the same entity, for example they may be provided by a single coil; such an arrangement also known as a mono coil arrangement. When the magnetic field transmitter 3 and the magnetic field receiver 5 are separate coils, it is also possible to position them as greatly separated coils, depending upon the application of the metal detector, and not necessarily position them together within the sensing head 1. The magnetic field transmitter 3 and the magnetic field receiver 5 can also be in any form and shape known to, and deemed suitable by, a person skilled in the art. Usually, the magnetic field transmitter 3 and the magnetic field receiver 5 are multi-turn/multi-winding coils.

Processing unit 11, which includes transmit and receive electronics, produces a transmit signal 13. In one embodiment, the transmit signal 13 is a repeating transmit signal cycle. The magnetic field transmitter 3, upon receiving the transmit signal 13, generates the transmit magnetic field 7.

The receive signal 15, generated by the receive magnetic field 9 being received by the magnetic field receiver 5, may be amplified and filtered, then processed by the processing unit 11 to produce an indicator output signal indicating a presence of a target under the influence of the transmit magnetic field 7.

Figure 2:
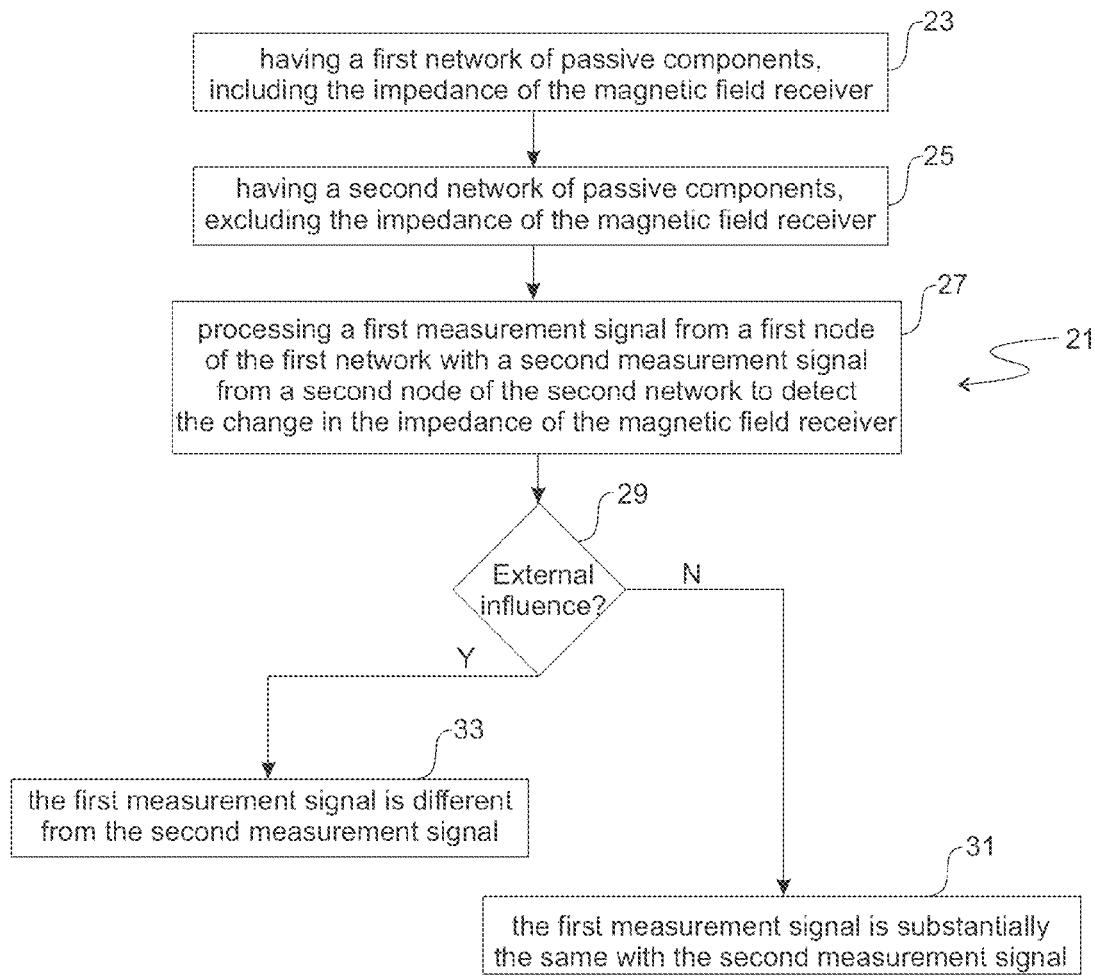
FIG. 2 illustrates the broad concept of the present invention.

FIG. 2 depicts the broad concept of the present invention. In a general form 21, there is provided a method for detecting a change of an impedance of a magnetic field receiver of a metal detector, including: having a first network of passive components, including the impedance of the magnetic field receiver 23; having a second network of passive components, excluding the impedance of the magnetic field receiver 25; processing a first measurement signal from a first node of the first network with a second measurement signal from a second node of the second network to detect the change in the impedance of the magnetic field receiver 27; wherein the first network, the second network, the first node, the second node are configured such that in an absence of an external influence 29 which affects the impedance of the magnetic field receiver, the first measurement signal is substantially the same as the second measurement signal 31; and in a presence of the external influence 29, the first measurement signal is different from the second measurement signal 33.

Figure 3:
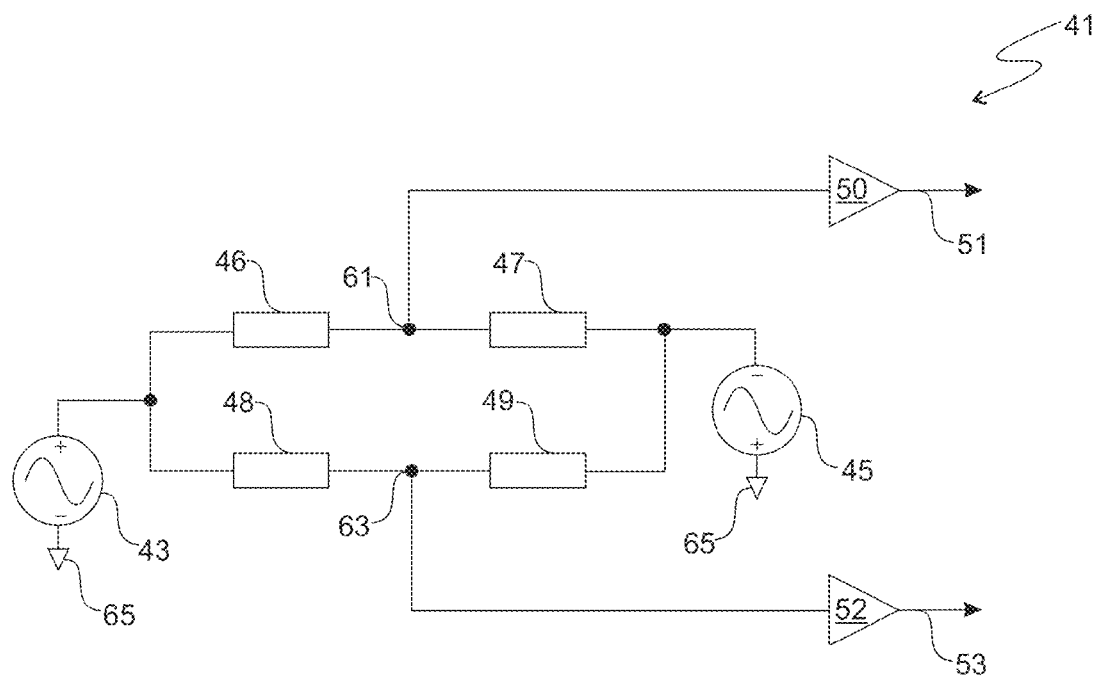
FIG. 3 depicts one embodiment of the invention.

FIG. 3 depicts one embodiment 41 of the invention where the generators 43 and 45 apply signals to the networks formed by the impedance pairs 46, 47 and 48, 49. The system ground is represented by items 65. The impedances 46 to 49 can be any known impedances including resistors, capacitors, inductors and the like. While in FIG. 3 the connections between the impedances in each pair are represented as electric contacts, it is possible that at least one of them can occur through other types of coupling (magnetic, capacitive, optical etc). It is also assumed that one of the impedances, e.g. impedance 46, represents a sensing element, which has one or more electric parameters varying in response to a change in its environment.

If the ratio of the voltages produced by the generators 43 and 45 is approximately equal to the ratio of impedances 46 and 47 (both in magnitude and in phase), then the signal at node 61 is very close to zero. This signal cancellation allows small variations in the parameters of the sensing element 46 to produce detectable signals at node 61 that are further amplified by the amplifier 50 to produce the output signal 51. However, if the noise voltages of the voltage generators 43 and 45 are not completely correlated and in exactly the same ratio as the signal voltages, they will appear at node 61 with only relatively modest attenuation. This noise will be also amplified by amplifier 50 and its relatively large amplitude in the output signal 51 will reduce the maximal sensitivity of the detector incorporating this circuit.

If the ratio of the impedances 46 and 47 is known and relatively stable, it is possible to remove most of the noise due to the voltage generators 43 and 45 and recover most of the potential sensitivity of the circuit. This is achieved by providing the impedances 48 and 49, having approximately the same ratio as have the impedances 46 and 47, and an amplifier 52 with similar gain and phase characteristics to those of amplifier 50. If these conditions are satisfied, then the signal magnitude at node 63 is relatively low, although not necessarily zero, while the noise voltage is essentially the same as that at node 61. Since neither 48 nor 49 is a sensing element, the output signal 53 does not respond to any of the changes in the environment that cause the output signal 51 to change. However, the noise voltages of each of the output signals 51 and 53 are highly correlated, making it possible to remove the noise of output signal 51 through measurements of the noise of output signal 53.

The correlation between the noise voltages superposed on the carrier signals 51 and 53 is maintained through the process of demodulation and transferred to their respective in phase (P) and in quadrature (Q) components. This can be described through the following correlation matrix:

$$\hat{C} = \begin{bmatrix} \dfrac{E\{P_1 \cdot P_2\}}{\sqrt{E\{P_1^2\}E\{P_2^2\}}} & \dfrac{E\{P_1 \cdot Q_2\}}{\sqrt{E\{P_1^2\}E\{Q_2^2\}}} \\ \dfrac{E\{Q_1 \cdot P_2\}}{\sqrt{E\{Q_1^2\}E\{P_2^2\}}} & \dfrac{E\{Q_1 \cdot Q_2\}}{\sqrt{E\{Q_1^2\}E\{Q_2^2\}}} \end{bmatrix}$$

where $E\{x \cdot y\}$ represents the expected value of the product, the cross-correlation, of the two zero mean random variables x and y; subscript 1 denotes output signal 51 and subscript 2 denotes output signal 53.

Knowledge of the correlation matrix $\hat{C}$ and continuous measurements and calculation of the signals $P_2$ and $Q_2$ allows the noise of the generators 43 and 45 to be removed from the signals $P_1$ and $Q_1$. This is obtained by forming the following linear combinations:

$$P'_1 = P_1 - \hat{c}_{11} P_2 - \hat{c}_{12} Q_2$$

$$Q'_1 = Q_1 - \hat{c}_{21} P_2 - \hat{c}_{22} Q_2$$

Figure 4:
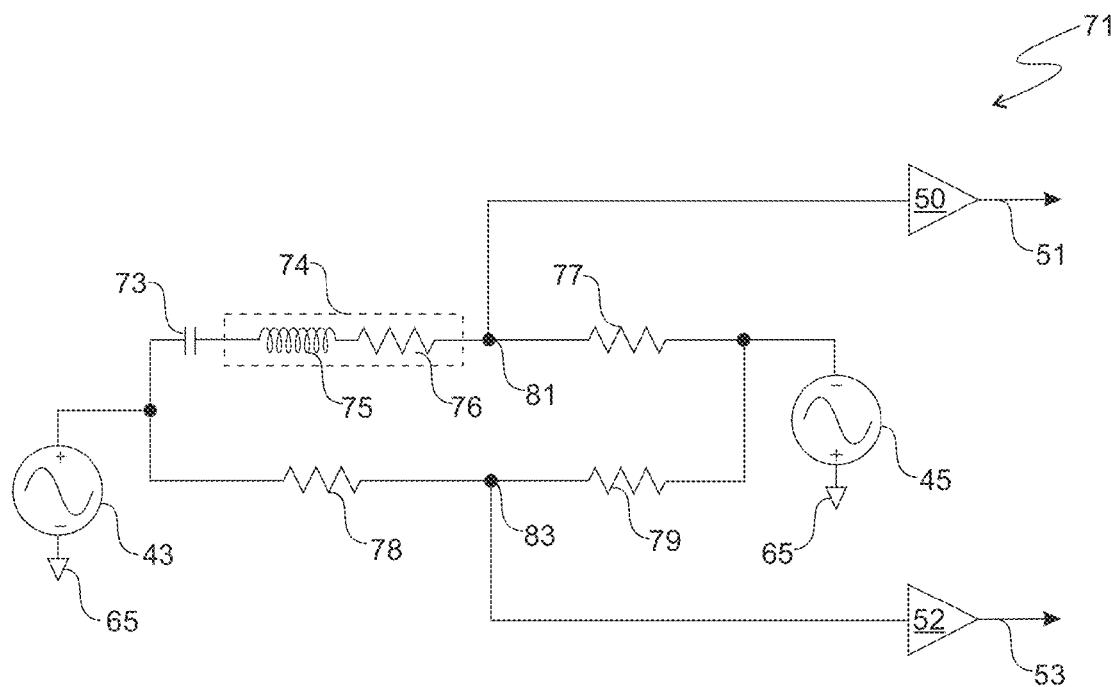
FIG. 4 illustrates a exemplary circuit for a metal detector with a single coil.

FIG. 4 illustrates a circuit 71 suitable for a metal detector with a single coil. In order to simplify the exposition, the case of a series resonant circuit is shown but the invention can be applied to parallel resonant circuits, non-resonant circuits, or the like.

This circuit is energised by the voltage generators 43 and 45 and the main path for the current consists of the coil 74 (represented by the inductor 75 and its series resistance 76), the tuning capacitor 73 and the resistor 77. The resistors 78 and 79 are chosen such that the ratio of their resistances is equal to that of the resistances of 76 and 77. In one form, resistance 76=resistance 77 and resistance 78=resistance 79. It can also be shown that this choice presents certain advantages. The accuracy of the matching can be of the order of 1%, well within the capabilities of readily available components. The amplifiers 50 and 52 have similar gain and phase characteristics, with a gain of about 25 at the operating frequency. Their output signals 51 and 53 are applied to the inputs of high resolution ADCs.

The circuit operates as follows: the generator 43 produces the reference signal, of known amplitude and phase, and with a frequency equal to the resonant frequency of the series tuned circuit formed by capacitance 73, inductance 75, resistance 76 and resistance 77. The generator 45 produces a signal with the same frequency and an amplitude and phase such that the voltage at node 81 is zero when the coil is in free space. It must be appreciated that the parasitic elements not represented in the circuit and the limited precision of the matching between 76 and 77 might require that the amplitude of the signal produced by the generator 45 vary by a few percent from that of the signal produced by generator 43 and the phases of the two signals might be required to vary by a few degrees from the ideal of 180°. Since 45 is numerically generated from independently adjustable in-phase (P) and in-quadrature (Q) signal components, any required variations can be effected easily and with very good accuracy. Both the search for the resonant frequency and the nulling of the signal at node 81 can be done automatically, by measuring the signal 51 with an ADC and resolving it into P and Q components; this information is then used to control the generators 43 and 45.

It should be noted that adjusting the generator 45 to minimise the voltage at node 81 does not necessarily mean that the voltage at node 83 is also minimised as the matching of the ratio of resistor 76/resistor 77 and the ratio of resistor 78/resistor 79 is not perfect. However, as long as the amplifier 52 and the ADC it feeds are within their linear range, the operation of the circuit is not impeded.

The voltage generators 43 and 45 are noisy and their noise may or may not be correlated. If the values of the resistors 76, 77, 78, 79 are kept relatively low, say less than 100Ω, the noise of the circuit will be dominated by the noise of the DACs and power amplifiers. Under the assumptions that the pairs of resistors are approximately equal and that the tuned circuit is at resonance, the noise of each generator will appear at each node 81 or 83 attenuated by a factor of 2. For example, the noise of the generator 43 will be reduced at node 81 by $R_{77}/(R_{76}+R_{77}) \sim 0.5$. This means that the noise that appears in the output signals 51 and 53 is the superposition of noise from each generator attenuated, then amplified by the same amount. This ensures that the noise in output signal 51 is highly correlated with the noise in output signal 53.

In view of the fact that the reactive elements 75 and 73 do not play any part in the noise reduction, their values are not constrained by the requirements of the cancellation. For example, the number of turns in the coil 75 and its inductance can be chosen such that the noises of the electronics are below the ambient electromagnetic noise that is received by the coil. Since the single coil system produces P and Q signals similar to the induction balanced system, the discrimination and ground rejection methods remain the same.

From a practical point of view, it is worth noting that the noise correlation between 51 and 53 depends rather weakly on the resistor matching. However, the signal amplitude at node 83 (when node 81 is nulled) depends quite strongly on the mismatch of the resistor ratios. Since the resistance of copper or aluminium varies significantly with the temperature (about 0.4%/° C.), some temperature compensation is required. There are well known techniques to achieve temperature compensation, for example if at least one of the resistors 77, 78, 79 varies with the temperature in a suitable way. In fact, the maximum gain of the amplifiers 50 and 52 is limited by the worst case difference between the ratios resistances 76/77 and 78/79.

Figure 5:
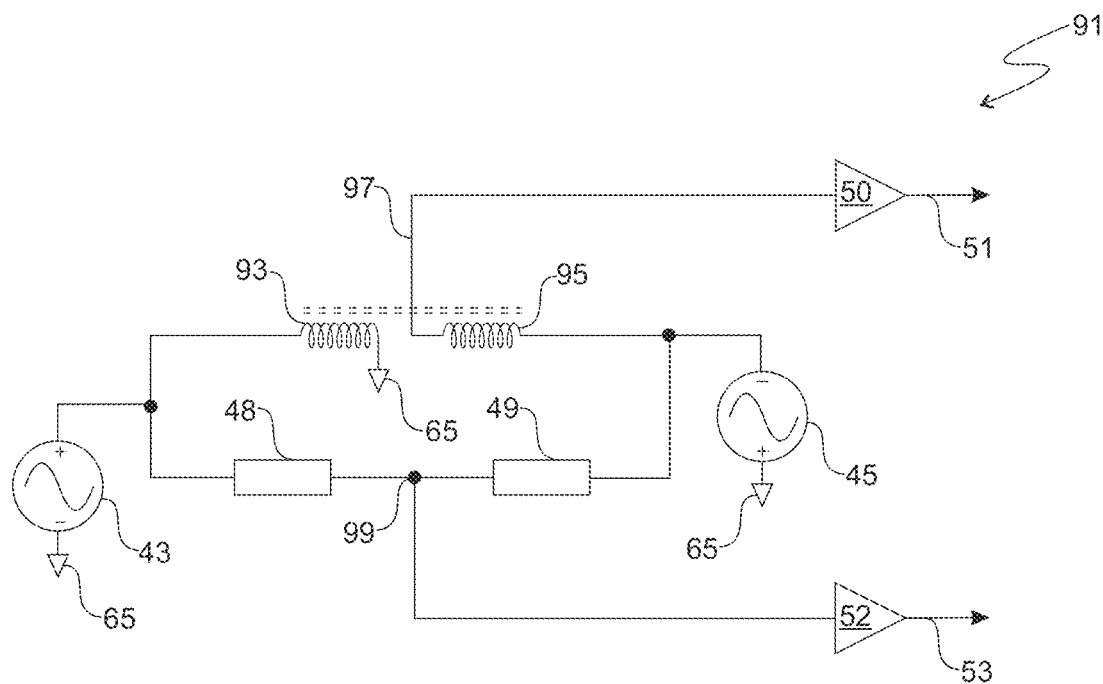
FIG. 5 depicts one embodiment of the invention for a metal detector with separate transmit-receive coils and non-resonant operation.

Another embodiment, with separate transmit-receive coils and non-resonant operation, is presented in FIG. 5. The voltage applied by the transmit generator 43 to the inductor 93, produces a current to flow in the windings of the inductor. The coupling existing between inductor 93 and inductor 95 induces a significant voltage in inductor 95, even in the absence of target or environmental influences. In order to avoid the saturation of the receiver amplifier built around the operational amplifier 50, a signal with the same amplitude as the induced voltage and opposite phase is generated by 45. In first approximation, the signal applied to the receiver amplifier (node 97) is:

$$v_{97} = j\omega M \frac{V_{43}}{j\omega L_{93}} - V_{45} \approx 0$$

where M is the mutual inductance between the transmit and receive inductors.

When the signal at node 97 is minimised, if the sign of the mutual coupling and the ratio of impedances 48 and 49 are suitably chosen, the signal at node 99 can be brought within prescribed limits:

$$|v_{99}| = \left| V_{43} \frac{Z_{49}}{Z_{48}+Z_{49}} - V_{45} \frac{Z_{48}}{Z_{48}+Z_{49}} \right| \leq v_{lim}$$

This maintains the outputs 51 and 53 of the amplifiers 50 and 52 within their linear ranges and also the inputs of the ADCs that follow them. The better the matching of the ratio of the impedances 48 and 49 with that of the voltage gain of the two coils, the more gain can be applied to the amplifiers 50 and 52.

When the noise is taken into account, it can be observed that the noise of the generator 45 is applied almost directly to the input of the amplifier 50, while the noise of the generator 43 is modified by the transformer action of the coupling between the transmit and receive coils. It can be shown that, similar to the single coil case, when the noise from each generator is transferred to the outputs 51 and 53, the correlation is maintained due to the signal nulling conditions. Therefore, by measuring the noise at the output 53 and using this correlation, it is possible to remove a substantial amount of noise present at the output 51.

It should be noted that the impedances 48 and 49 can be resistors, inductors or capacitors or combinations thereof. Unlike resistors, the reactive elements (capacitors, inductors) have the advantage that they do not introduce noise that cannot be removed through the correlation process. However, in general it is easier to obtain resistors with the values and accuracy required by the matching conditions described above. Furthermore, while non-resonant operation has been described, if power efficiency is desired, a parallel resonant circuit can be employed for transmission, without significant alteration of the circuit operation.

Experiments have confirmed that this method effectively eliminates the noise of the generators and achieves a signal-to-noise ratio comparable to that of the nulled coils.

In order to determine the performance of the coil having a mono-loop with removal of correlated noise, a metal detector was set-up to work with this coil and its characteristics were compared with those of a detector operating with a concentric coil (nulled) of the same size. The outer diameter of each coil was 203 mm and the operating frequency was set at 7.76 kHz. The circuit as shown in FIG. 4 was used wherein 73=27 nF, 75=16 mH, 76=18 ohms, 77=18 ohms, 78=79=100 ohms, and the gain of 50 and 52 was 23.

Figure 6:
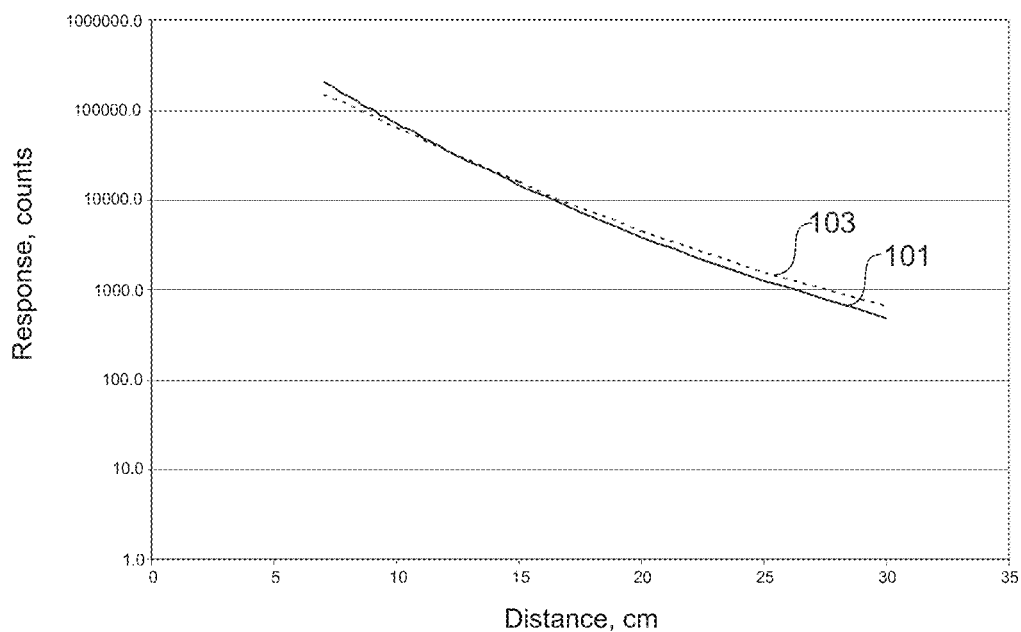
FIG. 6 depicts the results when two detectors were compared for sensitivity to targets, i.e. the magnitude of the response to a ball bearing versus distance.

In the first test, the two detectors were compared for sensitivity to targets, i.e. the magnitude of the response to a ball bearing versus distance. The result is shown in FIG. 6. It can be seen from FIG. 6 that the concentric coil (trace 101) responds marginally better when the target is closer, while the mono-loop coil (trace 103) has some advantage when the target is further. This is in very good agreement with theoretical calculations that take into account the geometry of the transmit and receive coils of the concentric coil. Such detail notwithstanding, it can be concluded that the target response of the two coils is quite similar.

If the response to targets of the two detectors is almost the same, then the ultimate performance (detection depth) is limited by the magnitude of the noise. The two graphs shown in FIGS. 7 and 8 respectively illustrate the improvement in the noise level, brought about by of the removal of the correlated noise in the detector with mono-loop coil.

Figure 7:
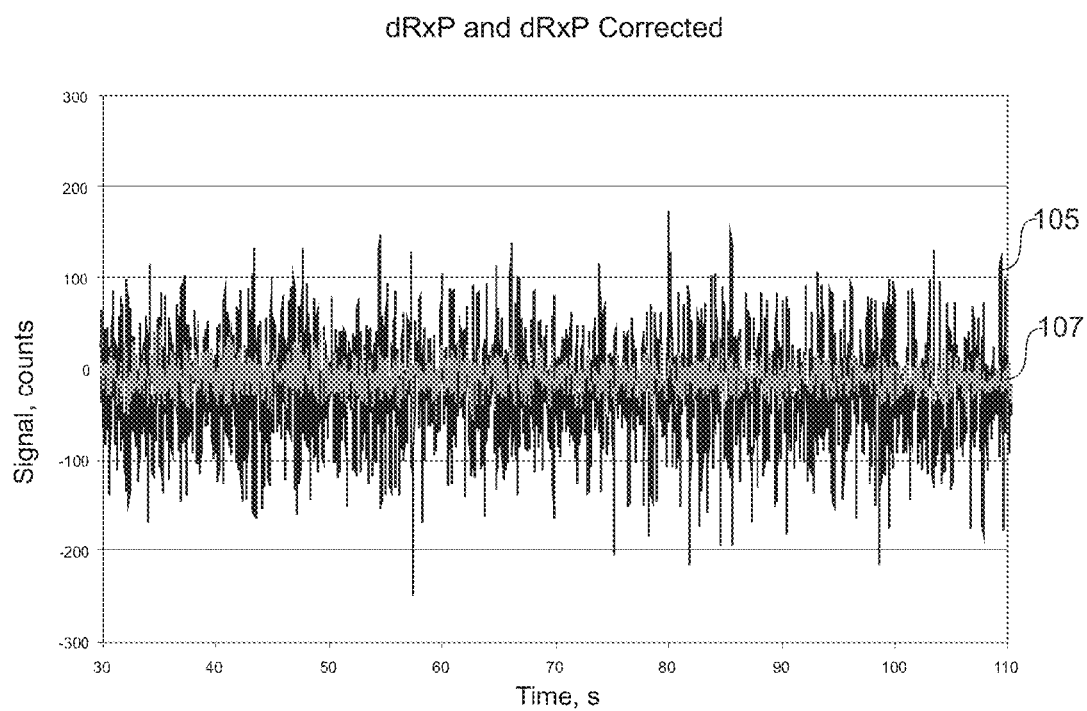
FIG. 7 shows the differentiated (high-pass filtered) in-phase (P) component, before and after the removal of the correlated noise.

FIG. 7 shows the differentiated (high-pass filtered) in-phase (P) component, before (trace 105) and after (trace 107) the removal of the correlated noise. The reason for using differentiated signals is that there is long time scale drift in the data and that would have made the interpretation of the results more difficult. In fact, for this reason most metal detectors use differentiated data for further signal processing.

The reduction in noise is by a factor of about 2.4 for root-mean-square (RMS) values.

Figure 8:
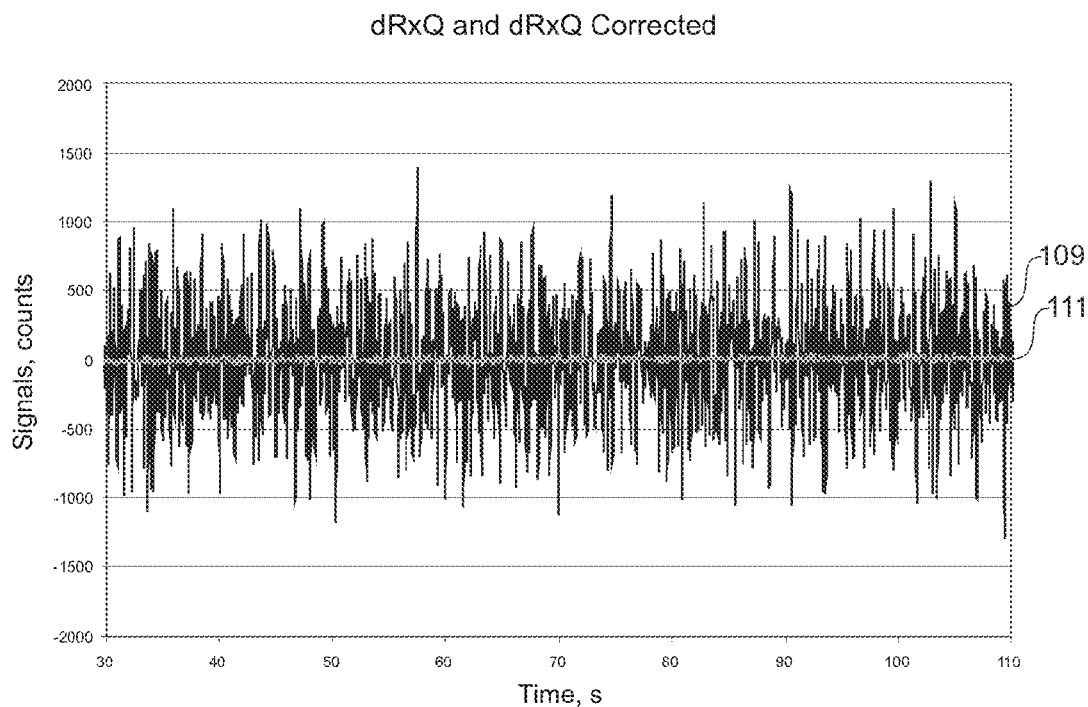
FIG. 8 shows the differentiated (high-pass filtered) in-quadrature (Q) component, before and after the removal of the correlated noise.

FIG. 8 shows the differentiated (high-pass filtered) in-quadrature (Q) component, before (trace 109) and after (trace 111) the removal of the correlated noise. The reduction in noise is by a factor of more than 22 for root-mean-square (RMS) values.

FIGS. 7 and 8 represent the noise in each component (P or Q) versus time. Another way to represent the noise is to plot Q versus P for a certain amount of time. This was done in FIGS. 9 and 10. The closer is the 'knot' to the origin of the axes, the lower is the noise floor of the detector and the better the detector is (it can detect smaller signals).

Figure 9:
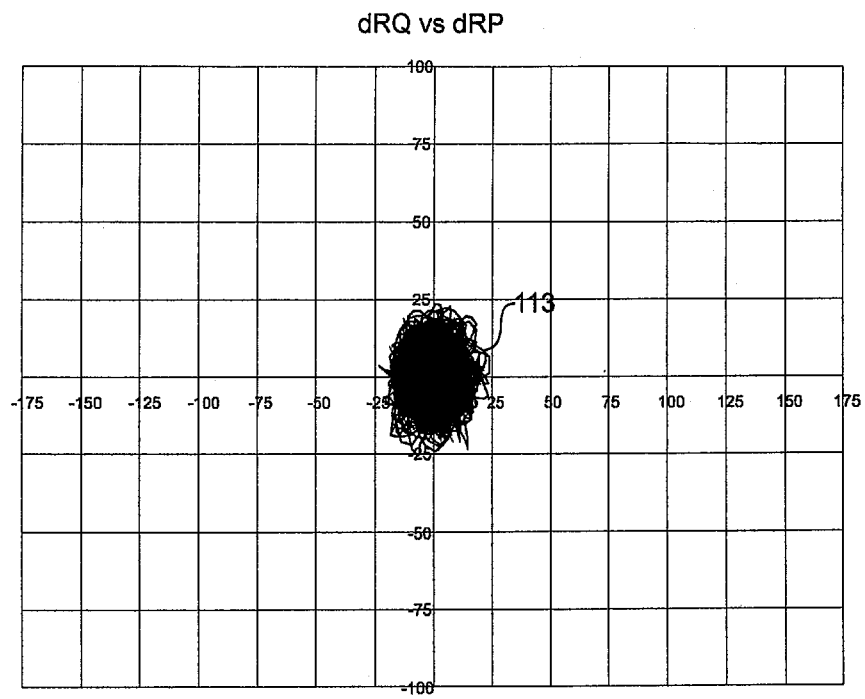
FIG. 9 shows the residual noise of the detector with concentric coil.

FIG. 9 shows the residual noise (trace 113) of the detector with concentric coil. Signals with P or Q components larger than about +/−25 counts start being resolved from noise. That is, signals with P or Q components with a magnitude larger than about 25 counts are detectable from the noise.

Figure 10:
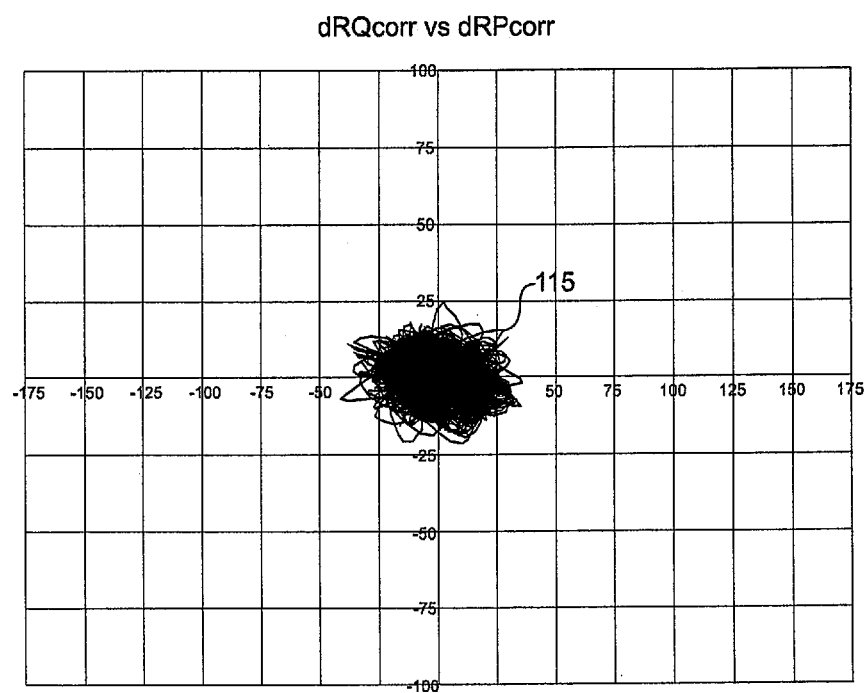
FIG. 10 shows the residual noise of the detector with mono-loop coil, after the removal of the correlated noise.

FIG. 10 shows the residual noise (trace 115) of the detector with mono-loop coil, after the removal of the correlated noise. It can be seen that it is quite similar to the previous graph. Since the targets are usually detected in the Q channel, it can be observed that its noise floor is about the same.

In conclusion, since both the sensitivity to targets and the noise floor of the two detectors are about the same, their performance must be similar. This demonstrates that the removal of the correlated noise using the circuitry of the current invention is effective.

Figure 11:
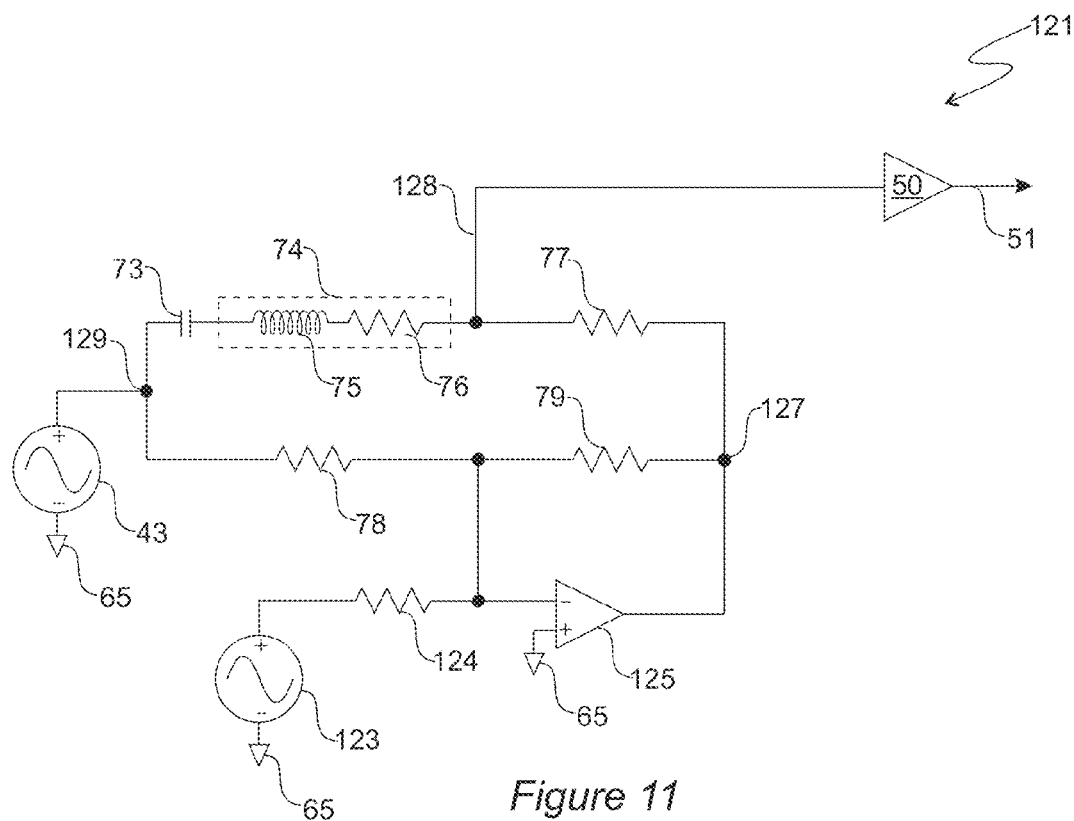
FIG. 11 depicts another embodiment of the invention.

FIG. 11 depicts another embodiment 121 of the present invention. Rather than having generator 45 (see embodiment depicted in FIG. 4) to provide a voltage at node 127, this embodiment includes a low noise amplifier 125 which, during operation, uses the voltage at node 129 as the input to an inverting amplifier consisting of low noise amplifier 125 and resistors 78 and 79. This inverting amplifier then, maintains the voltage at node 127 to be the inverting version of voltage (including noise) generated by generator 43. Thus, at node 128, the signal and the noise generated by generator 43 are cancelled in an ideal case since the voltage at point 129 is Voltage$_1$+Noise$_1$, the voltage at node 127 is −(Voltage$_1$+Noise$_1$)×ratio of resistances 79/78, the ratio of resistances 77/76 equals ratio of resistances 79/78, and the impedances of capacitor 73 and inductor 75 substantially cancel each other at an operating frequency. If resistances 76, 77 are of the same value, and therefore 78 and 79 are also of the same value, the voltage at node 127 is −(Voltage$_1$+Noise$_1$). This embodiment does not require amplifier 52 (see embodiment depicted in FIG. 4). Furthermore, the noise cancellation is performed in analogue form.

In practice, the ratio of resistances 77/76 may not exactly equal the ratio of resistances 79/78; furthermore, the inductor and capacitor may have parasitic elements (for example, parasitic capacitance for the inductor). Therefore, in order to achieve signal cancellation at node 128, the voltage at node 127 should be close to but not exactly equal in magnitude to Voltage$_1$×ratio of resistances 79/78 and close to but not exactly opposed in phase with Voltage$_1$. In this embodiment, the signal cancellation at node 128 is achieved by using a second generator 123 and the resistor 124, connected to the inverting input of the low-noise amplifier 125. This generator produces a compensation signal that is added to that produced by the signal at node 129. The amplitude and phase (or alternatively the in-phase and the in-quadrature components) of the compensation signal produced by the generator 123 are chosen such that, when taking into account the relative gain of this signal to node 127, it achieves the null at node 128.

This embodiment has the potential drawback that the noise of the generator 123 appears at the node 127, but it is not present at node 129. Therefore, it is not cancelled at node 128 and it could limit the sensitivity of the detector. However, because this is a signal required to compensate small imperfections only, the ratio of resistors 79/124 is substantially lower than one and the noise appearing at node 127 is substantially lower than that at the output of generator 123. Thus, with a judicious choice of generator noise, resistor values and good control of tolerances and parasitic elements, the contribution of this noise source can be made sufficiently small compared to the overall noise of the circuit.

Figure 12:
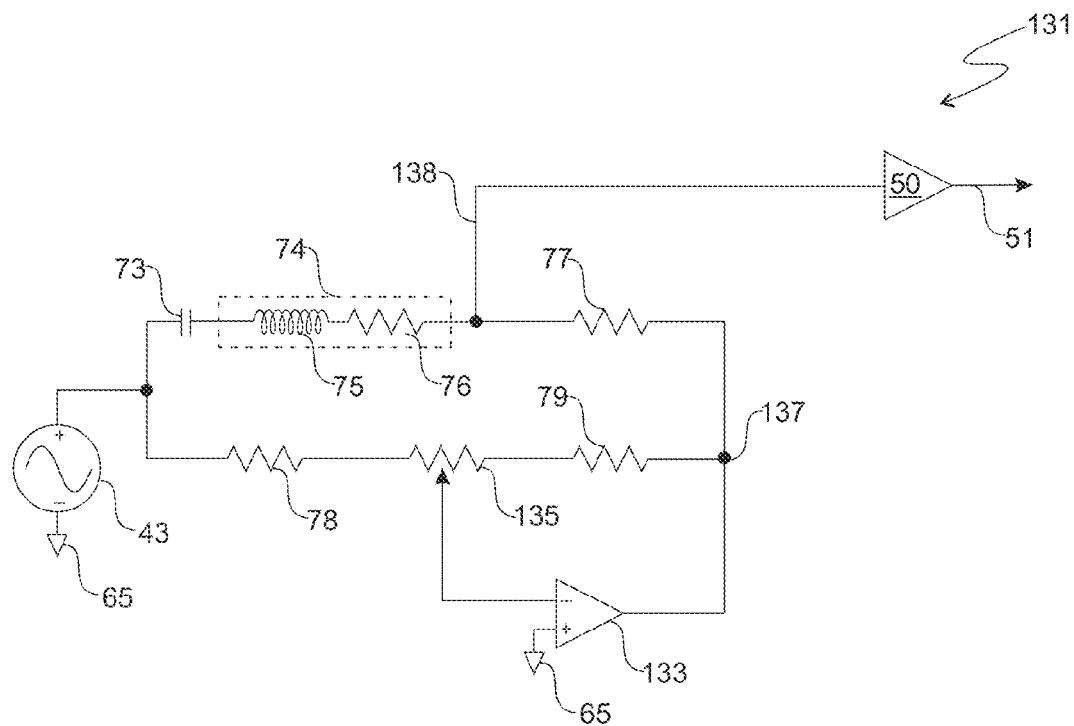
FIG. 12 depicts yet another embodiment of the invention.

FIG. 12 depicts yet another embodiment 131 of the present invention. This embodiment is similar to the embodiment of FIG. 11, but with a potentiometer 135 linked to inverting input of low-noise amplifier 133; and without generator 123, and resistor 124 of FIG. 11. In this embodiment, the wiper of potentiometer 135 can be adjusted to compensate for the tolerances in the resistor values of the circuit so the ratio of resistances (79+part of 135)/(78+part of 135) matches the ratios of resistances 77/76.

Compared to the embodiment 121 of FIG. 12, this embodiment 131 has the advantage that there is no source of unbalanced noise. However, the potentiometer 135 only allows adjustments of the amplitude, but not the phase, of the signal at node 138. The small phase shifts caused by various elements, such as the parasitic capacitance of the coil 74 and the low-noise amplifier 133, can be partially compensated by operating the circuit at a suitably chosen frequency such that the signal at node 138 can then be nulled with adjustments of the potentiometer. It should be noted that the potentiometer approach can be applied in combination with the embodiments depicted in FIG. 4 or 5, if it is desired to relax the tolerances for the matching between the ratios of the resistors 77/76 and 79/78.

In all the above embodiments the resistance of the coil is assumed to be constant, such that the pertinent ratios of resistors do not change. In practice, the windings may be made out of copper or aluminium. The resistances of windings made out of copper or aluminium vary substantially with the temperature. For example, copper will vary its resistance by almost +/−10% for a temperature change of +/−25° C. Given that the gain of the receiver amplifier is rather large, this would mean that the receiver amplifier could saturate for changes of temperature even less than 25° C. Furthermore, the DC drift of the demodulated signals may be very severe, thus limiting the performance of the detector. One way to compensate for the effects of changes of temperature is to include NTC and/or PTC resistors in the circuit. There may be disadvantages with this approach. For example, most NTC resistors have an exponential variation of resistance with the temperature, which does not match the almost linear variation of resistance with temperature for copper or aluminium. PTC resistors have an almost linear resistance variation with the temperature, so in principle they could be used to compensate the changes in the winding resistance. However, it may be difficult to thermally couple the winding and the PTC resistor in an effective way.

Figure 13:
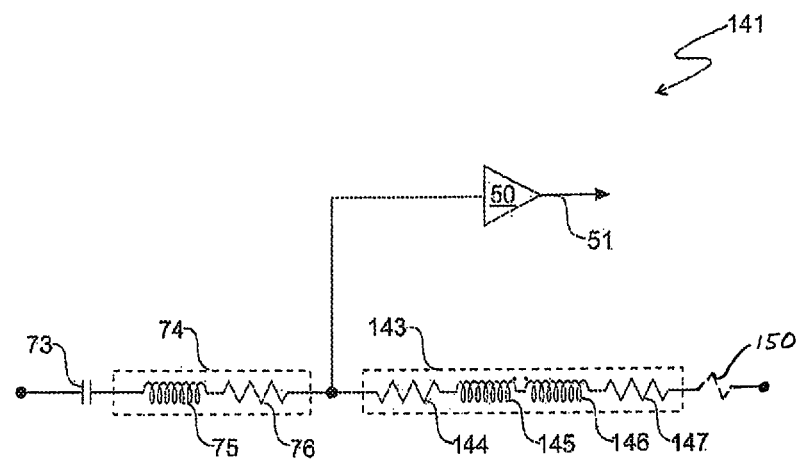
FIG. 13 depicts yet another embodiment of the invention.

FIG. 13 depicts yet another embodiment, where impedance 46 of FIG. 3 includes a capacitor 73, and coil 74 with inductance 75 and resistance 76 (both already described with reference to FIG. 4). Further, impedance 47 of FIG. 3 now includes a coil 143 with resistances 144 and 147, and inductances 145 and 146. The reason why the representations of coil 74 and coil 143 are different in FIG. 13 is that the coil 143 is a twisted bifilar coil which yields two strongly coupled windings connected in opposition. Note that coil 143 is not a coil for transmitting or for receiving magnetic field. Coil 143 functions as a resistor. In other words, transmit magnetic field from the coil 74 couples with the target and environment and back to coil 74, but not to the coil 143. This is because the magnetic field induces a voltage in ½ winding (e.g. the one made out of elements 144, 145) which is cancelled by the voltage induced in the other ½ winding (e.g. the one made out of elements 146, 147). The winding is not only bifilar, but also twisted, to make sure that both ½ windings experience exactly the same magnetic field. Therefore, the inductance of the winding 143 cancels out and the resistance adds up. In essence, due to the twisted bifilar windings, the effective inductance of coil 143 is zero. In one form, the resistance of 76 is equal to the sum of resistances 144 and 147.

Coils 74 and 143 are wound in such manner that they are thermally coupled very well and as isolated from the environment as possible, to ensure that they are as close in temperature to each other as possible at all times. Having the same temperature and same temperature coefficient of resistance, ensures that the ratio of resistances (144+147)/76 is substantially temperature independent. In one form, coil 143 is made of the same material as coil 74, for example copper, so that both coils have the same temperature coefficient.

It has been found experimentally and explained theoretically that, while the ratio of resistances (144+147)/76 is substantially temperature independent at DC or at very low frequency, at the typical operating frequencies of metal detectors, the effective temperature coefficient of the series resistance 76 of coil 74 is lower than that of the series resistance 144+147 of coil 143. The reason for this difference is that coil 74 experiences proximity effect losses, while coil 143 with its twisted bifilar winding does not.

In one form, a low temperature coefficient resistor 150 (shown in phantom in FIG. 13) is used in series with coil 143 to reduce the effective temperature coefficient of the coil 143 resistance. This matches the temperature coefficient of the coil 74, and the coil 143 including the low temperature coefficient resistor. For example, this matches the temperature coefficient of the resistance 76 with the temperature coefficient resistances 144, 147 and the low temperature coefficient resistor, even when the temperature changes in a range of 50° C. and the operating frequency is greater than 1 kHz. Otherwise, without the low temperature coefficient resistor, the ratio of resistances (144+147)/76 would be affected by the proximity effect, resulting in a non-ideal temperature-dependent output signal 51.

Alternatively, Litz wire or equivalent can be used in the construction of coil 74 to reduce proximity effects so that, even when the temperature changes, resistance 76 changes in a substantially similar manner to the sum of resistances 144 and 147. In one form, the Litz wire is made of several individual fine strand of wires, for example, 5, 6, 7 or 8 strands of wires.

Figure 14:
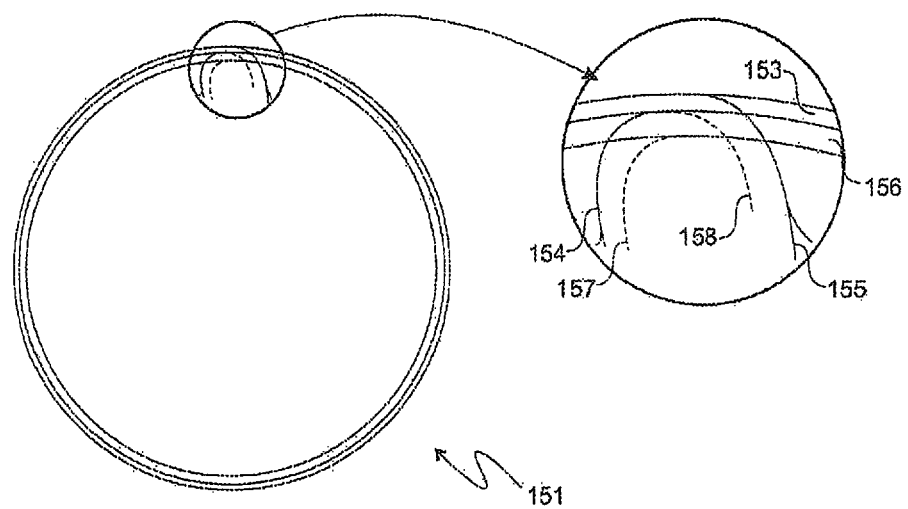
FIG. 14 depicts an exemplary coil for one embodiment of the invention.

FIG. 14 depicts an exemplary embodiment showing a way to construct coil 74 and coil 143 of FIG. 13. In this embodiment, coil 151 includes an outer coil 153 and an inner coil 156. Inner coil 156 is made of windings of Litz copper wire with 157 and 158 representing the beginning of the first winding, and the end of the last winding respectively. In this embodiment, the inner coil 156 represents coil 74 of FIG. 13. Outer coil 153 is made of windings of twisted pair copper wire with 154 and 155 representing the beginning of the first winding, and the end of the last winding of the outer coil respectively. In this embodiment, the outer coil 153 represents coil 143 of FIG. 13. Of course, it is possible to have the role of outer coil and inner coil reversed, with the outer coil being coil 74 and the inner coil being coil 143. The windings of the outer coil and windings of the inner coil are positioned close to each other to allow good thermal coupling between them. It is also possible to stack the coils on each other, rather than having inner/outer coils.

Those of skill in the art would understand that information and signals may be represented using any of a variety of technologies and techniques. For example, data, instructions, commands, information, signals, bits, symbols, and chips may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system Skilled artisans may implement the described functionality in varying ways for each particular application, but such implementation decisions should not be interpreted as causing a departure from the scope of the present invention.

The steps of a method or algorithm described in connection with the embodiments disclosed herein may be embodied directly in hardware, in a software module executed by a processor, or in a combination of the two. For a hardware implementation, processing may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof. Software modules, also known as computer programs, computer codes, or instructions, may contain a number a number of source code or object code segments or instructions, and may reside in any computer readable medium such as a RAM memory, flash memory, ROM memory, EPROM memory, registers, hard disk, a removable disk, a CD-ROM, a DVD-ROM or any other form of non-transitory computer readable medium. In the alternative, the computer readable medium may be integral to the processor. The processor and the computer readable medium may reside in an ASIC or related device. The software codes may be stored in a memory unit and executed by a processor. The memory unit may be implemented within the processor or external to the processor, in which case it can be communicatively coupled to the processor via various means as is known in the art.

Throughout the specification and the claims that follow, unless the context requires otherwise, the words "comprise" and "include" and variations such as "comprising" and "including" will be understood to imply the inclusion of a stated integer or group of integers, but not the exclusion of any other integer or group of integers.

The reference to any prior art in this specification is not, and should not be taken as, an acknowledgement of any form of suggestion that such prior art forms part of the common general knowledge.

It will be appreciated by those skilled in the art that the invention is not restricted in its use to the particular application described. Neither is the present invention restricted in its preferred embodiment with regard to the particular elements and/or features described or depicted herein. It will be appreciated that the invention is not limited to the embodiment or embodiments disclosed, but is capable of numerous rearrangements, modifications and substitutions without departing from the scope of the invention as set forth and defined by the following claims.

What is claimed is:

1. A method for detecting a change of an impedance of a magnetic field receiver of a metal detector, including:
   having a first network of passive components, including a first node and the impedance of the magnetic field receiver; and
   having a second network of passive components, including a second node different from the first node and excluding the impedance of the magnetic field receiver;
   wherein the first network, the second network, the first node, the second node are configured such that, in an absence of an external influence that would otherwise affect the impedance of the magnetic field receiver, the voltage at the first node is substantially the same as the voltage at the second node; and in a presence of the external influence, the voltage at the first node is different from the voltage at the second node;
   wherein the first node and the second node are further configured such that the voltage at the first node and the voltage at the second node are substantially zero in an absence of the external influence;
   wherein the first network of passive components further includes a first coil different from the magnetic field receiver, wherein the first coil is made of bifilar windings of wire such that the resistance of the first coil is non-zero and the inductance of the first coil is effectively zero such that the first coil acts as a resistor in the first network of passive components while the magnetic field receiver detects the external influence; and
   wherein the magnetic field receiver is a second coil, wherein windings of the first coil and windings of the second coil are positioned close to each other to allow thermal coupling between them, wherein the first coil and the second coil are comparable in size and shape and are arranged to form a shape of a single coil.

2. The method of claim 1, wherein the bifilar windings of wire are bifilar windings of twisted wire.

3. The method of claim 1, wherein the first network of passive components includes a resistor having low temperature coefficient in series with the first coil to reduce the effective temperature coefficient of the resistance of the first coil so as to match the temperature coefficient of the second coil.

4. The method of claim 1, wherein the second coil is made of Litz wire to reduce or eliminate proximity effect losses within the windings of the second coil and to match the temperature coefficient of the resistance of the second coil to that of the resistance of the first coil.

5. The method of claim 1, wherein the first network, the second network, the first node, the second node are configured such that a first ratio of impedances of passive components within the first network and a second ratio of impedances of passive components within the second network are the same.

6. The method of claim 1, wherein the first network of passive components further includes the impedance of a magnetic field transmitter of the metal detector.

7. The method of claim 6, wherein the first network of passive components further includes a capacitor whose impedance is equal to the opposite of that of an inductance of the magnetic field transmitter at a selected operating frequency of the metal detector.

8. The method of claim 6, wherein the magnetic field transmitter and the magnetic field receiver are the same entity.

9. The method of claim 1, wherein a noise in a first measurement signal, measured at the first node, is cancelled, or at least reduced, by subtracting a second measurement signal, measured at the second node, from the first measurement signal.

10. The method of claim 1, further including:
    having a first generator and a second generator, separate from the first generator, to generate and feed two signals to the first network of passive components and the second network of passive components, the two signals have relative phases that are within a few degrees of 180 degrees of each other.

11. The method of claim 1, further including:
    having a first generator to generate and feed a generated signal to the first network of passive components and the second network of passive components, and a low-noise amplifier to produce an inverted signal, based on the generated signal, fed to the first network of passive components and the second network of passive components, the generated signal and the inverted signal have relative phases that are within a few degrees of 180 degrees of each other.

12. The method of claim 11, wherein a frequency of generated signal is selected to be the resonant frequency of the first network.

13. The method of claim 5, wherein the second network of passive components further includes a potentiometer, configurable to match the ratio of resistances of the second network of passive components to the ratio of resistances of the first network of passive components.

14. A metal detector for detecting a target by detecting a change of an impedance of a magnetic field receiver of the metal detector including:
   a first network of passive components, including a first node and the impedance of the magnetic field receiver; and
   a second network of passive components, including a second node different from the first node, and excluding the impedance of the magnetic field receiver;
   wherein the first network, the second network, the first node, the second node are configured such that, in an absence of an external influence that would otherwise affect the impedance of the magnetic field receiver, the voltage at the first node is substantially the same as the voltage at the second node; and in a presence of the external influence, the voltage at the first node is different from the voltage at the second node;
   wherein the first node and the second node are further configured such that the voltage at the first node and the voltage at the second node are substantially zero in an absence of the external influence;
   wherein the first network of passive components further includes a first coil different from the magnetic field receiver, wherein the first coil is made of bifilar windings of wire such that the resistance of the first coil is non-zero and the inductance of the first coil is effectively zero such that the first coil acts as a resistor in the first network of passive components while the magnetic field receiver detects the external influence; and
   wherein the magnetic field receiver is a second coil, wherein windings of the first coil and windings of the second coil are positioned close to each other to allow thermal coupling between them, wherein the first coil and the second coil are comparable in size and shape and are arranged to form a shape of a single coil.

15. A metal detector configurable to perform the method of claim 1.

16. The method of claim 1, wherein the first node is arranged to be between (a) the impedance of the second coil and (b) the resistance of the first coil in series with the impedance of the second coil.

* * * * *